(12) United States Patent
Davison et al.

(10) Patent No.: US 6,496,372 B1
(45) Date of Patent: Dec. 17, 2002

(54) HEAT SINK FASTENER FOR AN ELECTRONIC DEVICE

(75) Inventors: Peter A. Davison, Puyallup, WA (US); Lee M. Langseth, Hillsboro, OR (US); Patrick S. Johnson, Tacoma, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/964,233

(22) Filed: Sep. 26, 2001

(51) Int. Cl.$^7$ ................................................ H05K 7/20
(52) U.S. Cl. ...................... 361/704; 361/707; 361/709; 174/16.3; 165/80.3; 257/718; 257/719; 257/727; 24/453; 24/297; 411/508; 411/509; 411/510
(58) Field of Search .............................. 361/704–712, 361/717–722; 257/706, 718, 719, 727; 165/80.2, 80.3; 24/453, 297; 174/16.3; 411/508, 509

(56) References Cited

U.S. PATENT DOCUMENTS

| | | | | |
|---|---|---|---|---|
| 1,382,112 A | * | 6/1921 | Mitchell | ...................... 24/453 |
| 1,803,431 A | * | 5/1931 | Hill | ............................. 411/349 |
| 4,674,910 A | * | 6/1987 | Hayashi | ................... 403/408.1 |
| D336,604 S | * | 6/1993 | Fujimoto | ...................... D8/354 |
| 5,384,940 A | * | 1/1995 | Soule et al. | .................. 24/453 |
| 6,061,240 A | * | 5/2000 | Butterbaugh et al. | ....... 361/704 |
| 6,105,215 A | * | 8/2000 | Lee | .............................. 24/458 |
| 6,112,378 A | * | 9/2000 | Lee | .............................. 24/458 |
| 6,301,113 B1 | * | 10/2001 | Guerrero | .................... 361/704 |
| 6,304,452 B1 | * | 10/2001 | Lo | .............................. 361/704 |
| D451,789 S | * | 12/2001 | Hsieh | .......................... D8/382 |

\* cited by examiner

*Primary Examiner*—Gerald Tolin
(74) *Attorney, Agent, or Firm*—Schwegman, Lundberg, Woessner & Kluth, P.A.

(57) ABSTRACT

The present invention relates to an electronic assembly that includes an integrated circuit package, a heat sink, and a fastener which connects the heat sink to the integrated circuit package to cool the integrated circuit package. The fastener includes a stem that extends through the heat sink and the integrated circuit package. The fastener further includes a clamp that is connected to one end of the stem and a spring head that is connected to an opposing end of the stem. The spring head includes a first biasing member that extends around the longitudinal axis of the stem to compress the heat sink and the integrated circuit package against the clamp in order to reduce the thermal impedance between the heat sink and the integrated circuit package.

19 Claims, 5 Drawing Sheets

US 6,496,372 B1

HEAT SINK FASTENER FOR AN ELECTRONIC DEVICE

TECHNICAL FIELD OF THE INVENTION

The present invention relates to a fastener that thermally couples a heat sink to an integrated circuit package in an electronic device.

BACKGROUND

Electronic devices generate heat during operation. Thermal management refers to the ability to keep temperature-sensitive elements in an electronic device within a prescribed operating temperature. Thermal management has evolved to address the increased heat generation created within such electronic devices as a result of the increased speed and power that are associated with ever-improving electronic devices.

The advent of such high performance electronic devices now requires more innovative thermal management. Each of these increases in speed and power generally carries a cost of increased heat generation such that additional innovations must be made to provide proper thermal management.

Several methods have been employed for cooling electronic devices that include high performance integrated circuits. One method of cooling these types of devices is by attaching heat sinks to the devices. Integrated circuits are typically assembled into packages that are soldered, or plugged into, a motherboard on a computer. One or more heat sinks are typically mounted to the motherboard, or some part of the integrated circuit packages, in order to provide cooling to the integrated circuit packages during operation of the computer.

A number of conventional fasteners are used to attach the heat sinks to the integrated circuit packages and/or the motherboards. The fasteners extend through clearance holes in the integrated circuit package and the heat sink, and are constructed to exert a spring force that presses the heat sink against one or more of the integrated circuit packages. Compressing the heat sinks against the integrated circuit packages decreases the thermal impedance between the integrated circuit packages and the heat sinks.

The fasteners that are presently used to fasten heat sinks to integrated circuit packages are relatively expensive to produce and assemble. It would be desirable to provide a fastener that can be readily assembled to exert a spring force on the interface between a heat sink and an integrated circuit package, and is relatively inexpensive to produce and assemble.

DETAILED DESCRIPTION

Figure 1:
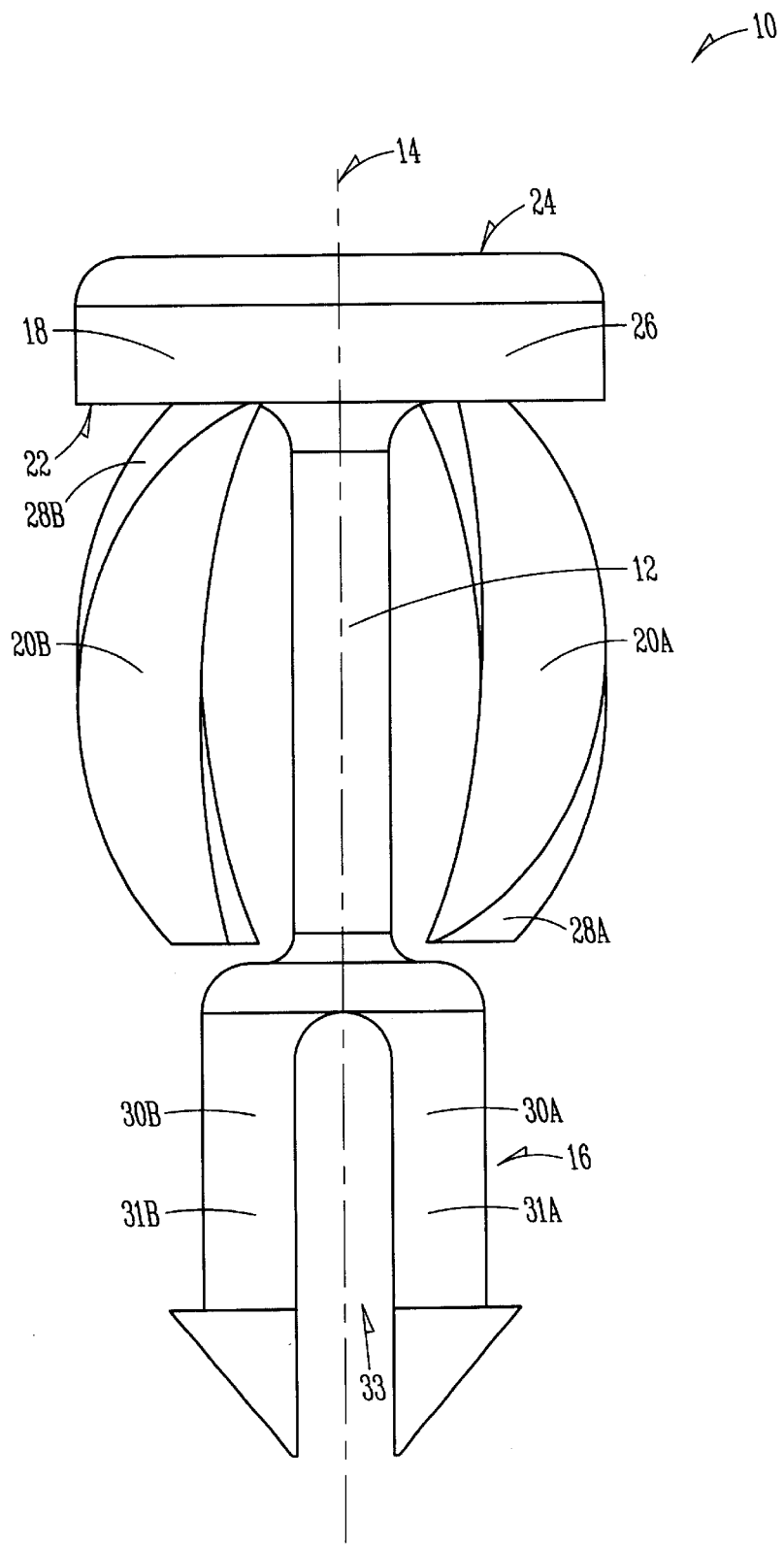
FIG. 1 is a side view showing a fastener of the present invention.

In the following detailed description of the invention reference is made to the accompanying drawings, which form a part hereof, and in which are shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and electrical changes may be made, without departing from the scope of the present invention.

Figure 2:
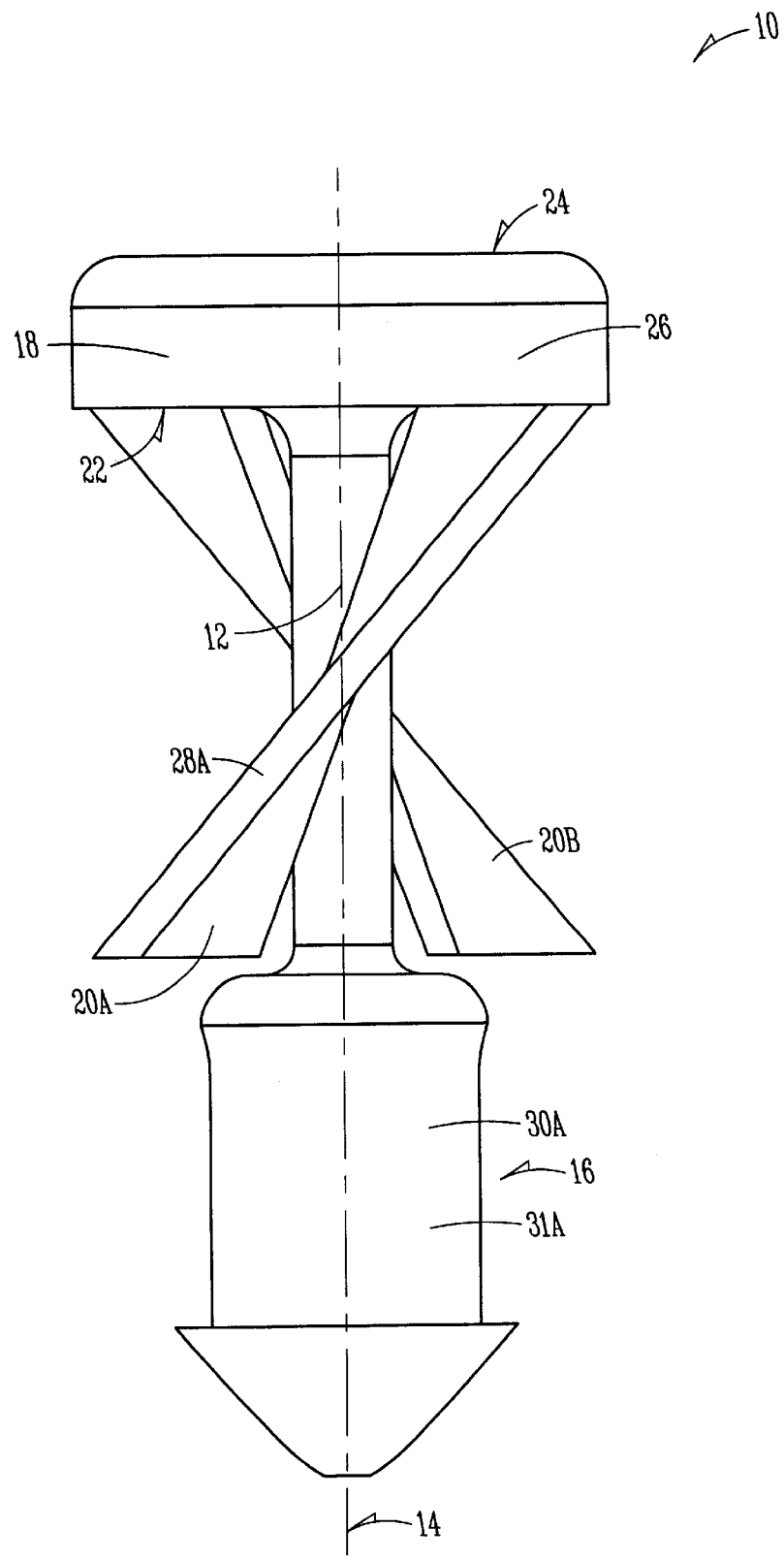
FIG. 2 is another side view of the fastener shown in FIG. 1.
Figure 3:
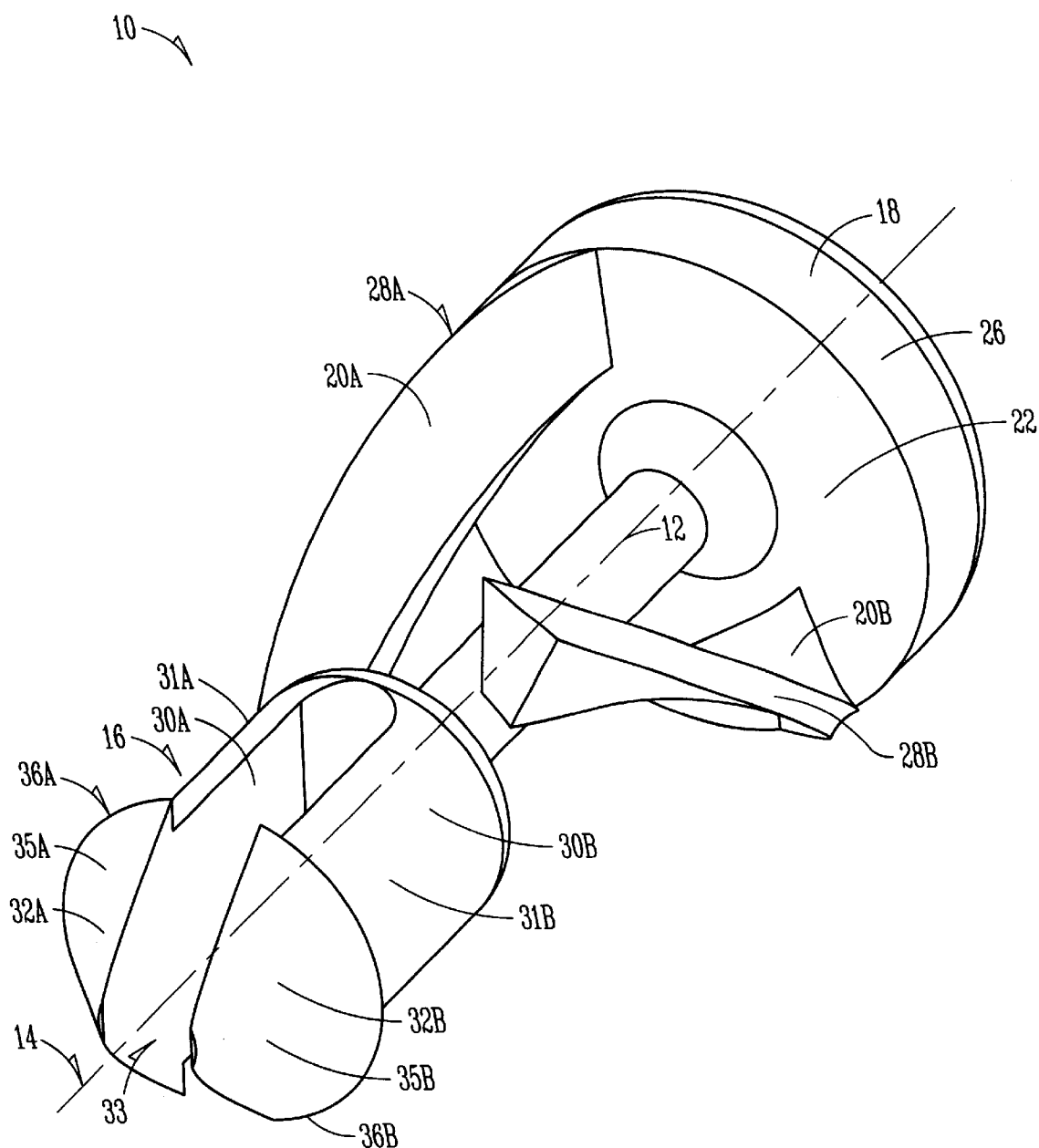
FIG. 3 is a perspective view of the fastener shown in FIGS. 1 and 2.

FIGS. 1–3 illustrate a fastener 10 for an electronic assembly of the present invention. The fastener 10 includes a stem 12 having a longitudinal axis 14. A clamp 16 is connected to one end of the stem 12 and a spring head 18 is connected to an opposing end of the stem 12. The spring head 18 includes a first biasing member 20A and a second biasing member 20B that extend around the longitudinal axis 14 of the stem 12. The design of the spring head 18 allows the fastener 10 to be relatively inexpensive to produce and assemble. The spring head 18 further includes an inner surface 22, an outer surface 24 and a radial surface 26 such that the biasing members 20A, 20B extend from the inner surface 22 of the spring head 18 toward the clamp 16. The biasing members 20A, 20B are preferably positioned on opposing sides of longitudinal axis 14 of the stem 12. The biasing members 20A, 20B generate a compressive force which is substantially parallel to the longitudinal axis 14 of the stem 12 when the fastener 10 is used in an electronic assembly. Each of the biasing members may also include a respective outer edge 28A, 28B that is aligned with the radial surface 26 of the spring head 18 at the point where each biasing arm 20A, 20B extends from the inner surface 22 of the spring head 18.

The clamp 16 includes a first arm 30A that is positioned on one side of the longitudinal axis 14 of the stem 12 and a second arm 30B that is positioned on an opposing side of the longitudinal axis 14 of the stem 12. The arms 30A, 30B each include a respective outside surface 31A, 31B that would form a cylindrical surface with the other outside surface 31A, 31B if it were not for a cavity 33 that separates the arms 30A, 30B. One end on each of the first and second arms 30A, 30B is connected to the stem 12 and the other end on each of the first and second arms 30A, 30B is connected to a respective stop 32A, 32B. The stops 32A, 32B each include a respective rounded surface 35A, 35B that would form a conical surface with the other rounded surface 35A, 35B if it were not for the cavity 33. The rounded surfaces 35A, 35B on the stops 32A, 32B each includes an edge 36A, 36B. The width of the clamp 16 at the edges 36A, 36B of the stops 32A, 32B, is greater than the width of the arms 30A, 30B as defined by the outside surfaces 31A, 31B of the arms 30A, 30B.

The stem 12, the spring head 18 and the clamp 16 are preferably constructed as an integrally molded plastic part, although it should noted none, or any combination of the stem 12, spring head 18, and clamp 16, may be integrally molded together without departing from the scope of the present invention. The fastener is preferably injection molded using ULTEM® 1010R manufactured by GE Plastics, although other materials could be utilized without departing from the scope of the present invention. The fastener 10 illustrated in FIGS. 1–3 may also be molded with tooling that is not overly complicated resulting in a low-cost yet efficient manufacturing operation.

The invention is not limited to the configuration shown in FIGS. 1–3. The fastener 10 may also include any number of biasing members extending around the longitudinal axis 14 of the stem 12. If the number of biasing members is two or more, then the biasing members are preferably equally spaced around the longitudinal axis 14 of the stem 12 to generate a compressive force which is substantially parallel to the longitudinal axis 14 of the stem 12.

Figure 4:
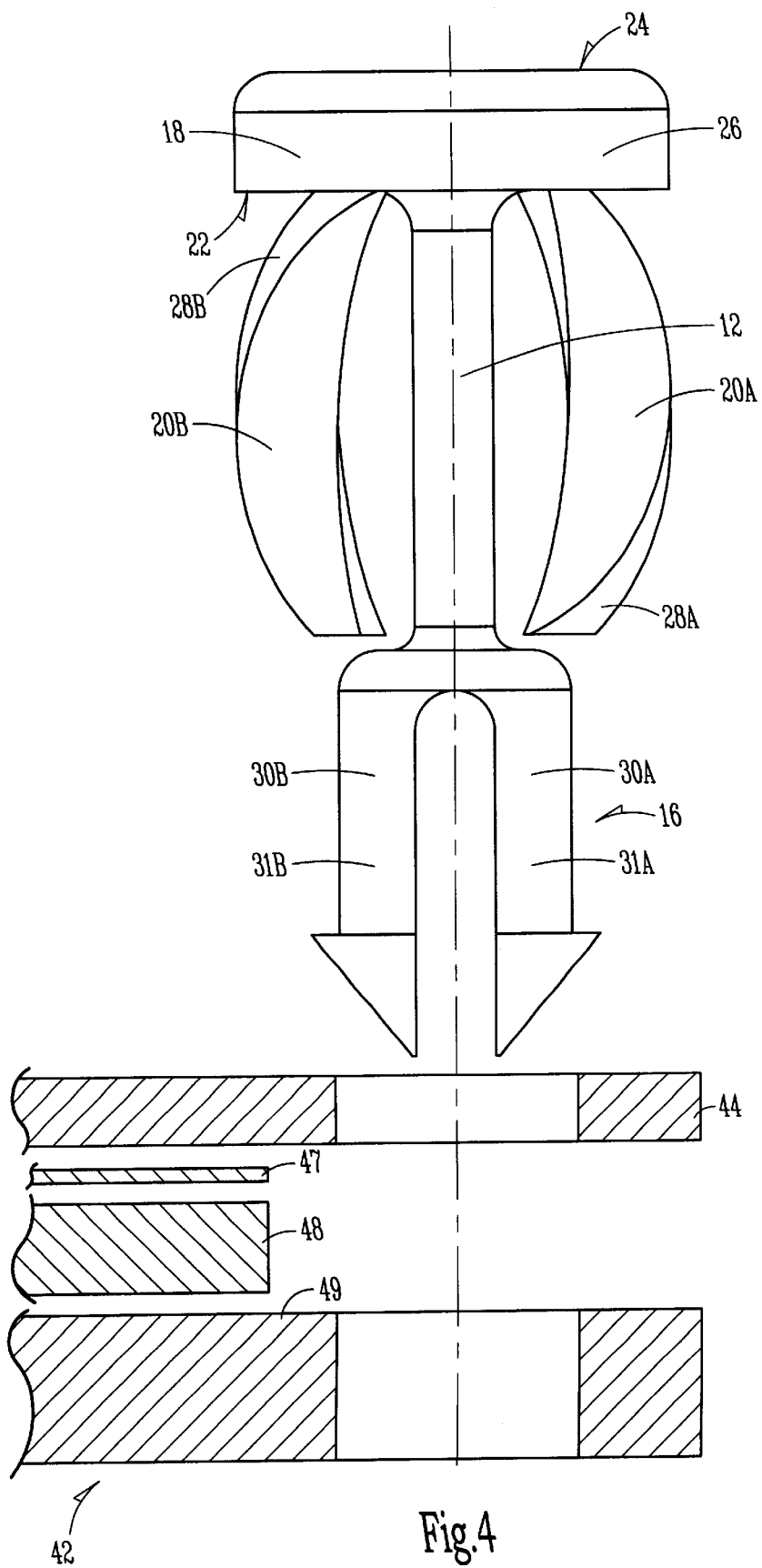
FIG. 4 is an exploded view showing a portion of an electronic assembly of the present invention.
Figure 5:
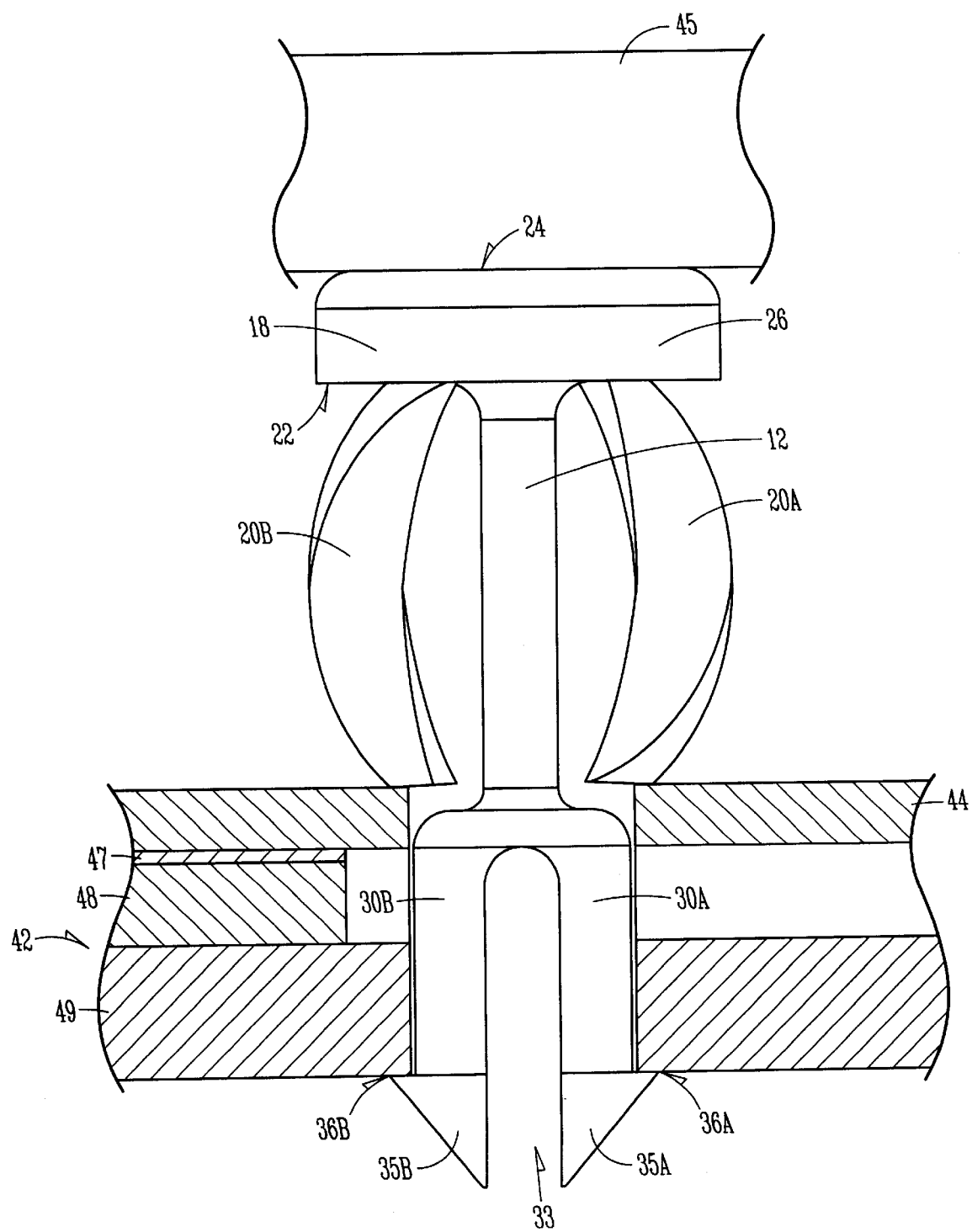
FIG. 5 is an assembly view of the portion of the electronic assembly shown in FIG. 4.

FIGS. 4 and 5 illustrate an electronic assembly 40 of the present invention. The electronic assembly 40 includes an integrated circuit package 42 that is connected to a heat sink 44 by the fastener 10 shown in FIGS. 1–3. The fastener 10 compresses the heat sink 44 against the integrated circuit package 42 in order to cool the integrated circuit package 42 as the integrated circuit packages 42 generates heat during operation.

The heat sink 44 and the integrated circuit package 42 are assembled together by forcing the clamp 16 through aligned openings in the integrated circuit package 42 and the heat sink 44. The clamp 16 may also be forced through the aligned openings in the integrated circuit package 42 and the heat sink 44 by using a tool, such as punch 45. As the clamp 16 is forced through the openings in the integrated circuit package 42 and the heat sink 44, the arms 30A, 30B of the clamp 16 are compressed together due the cavity 33 between the arms 30A, 30B. The clamp 16 is forced through the openings until the edges 36A, 36B, on the stops 32A, 32B have passed entirely through the openings at which time the arms 30A, 30B and the stops 32A, 32B spring back to their original position (FIG. 5). The width of the edges 36A, 36B on the stops 32A, 32B is greater than the width of the openings in the integrated circuit package 42 and the heat sink 44 such that the stops 32A, 32B prevent the fastener 10 from being pulled back through the openings.

The stem 12 is positioned within the openings in the integrated circuit package 42 and the heat sink 44 when the fastener 10 is secured in place. In addition, the first and second biasing members 20A, 20B are compressed against the heat sink 44 and/or the integrated circuit package 42. The compressed biasing members 20A, 20B force the heat sink 44 and the integrated circuit package 42 against one another and the stops 32A, 32B. Compressing the heat sink 44 and the integrated circuit package 42 against one another reduces the thermal impedance between the heat sink 44 and the integrated circuit package 42.

A thermally conductive material 47, such as CHOMERICS® T710 or CHOMERICS® T454, may also be placed between the integrated circuit package 42 and the heat sink 44 in thin sheet form before the integrated circuit is placed into operation. Both CHOMERICS®T710 and CHOMERICS®T454 change phases during the initial operation of the integrated circuit package 42 to form a bond between the heat sink 44 and the integrated circuit 42 that further reduces the thermal impedance between the heat sink 44 and the integrated circuit package 42 over the life of the electronic assembly 40.

The example embodiments described above are shown with the fastener 10 connecting an integrated circuit package 42 to a heat sink 44. In the illustrated embodiment, integrated circuit package 42 includes a chipset 48 mounted onto a motherboard 49 such that heat sink 44 is fastened to the chipset 48 in order to cool chipset 48. The thin sheet of thermally conductive grease 47 is placed between chipset 48 and heat sink 44 as the heat sink 44 is assembled to the integrated circuit 42 using the fastener 10.

One of the advantages of utilizing the fastener 10 described herein is that the fastener 10 can be used to assemble a wide variety of industry standard integrated circuit packages to a heat sink that cools the integrated circuit packages. The fastener 10 can also be made in a one-piece configuration that minimizes the assembly time and the chance for disassembly during shipment. The fastener 10 is also simple and inexpensive to manufacture compared to existing fasteners.

The fastener 10 described above provides a universally applied solution for heat-generating electronic devices. The universal applicability provides thermal engineers with a cost-effective option for cooling parts of an electronic assembly such as a chipset mounted on a motherboard. Many other embodiments will be apparent to those of skill in the art upon reviewing the above description. The scope of the invention should be determined with reference to the appended claims along with the full scope of equivalents to which such claims are entitled.

What is claimed is:

1. A fastener for an electronic assembly, the fastener comprising:

a stem having a longitudinal axis;
   a clamp connected to one end of the stem; and
   a spring head connected to an opposing end of the stem, the spring head including a first biasing member spiraling around the longitudinal axis of the stem toward the clamp, the stem, the spring head and the biasing member are constructed as an integrally molded plastic part.

2. The fastener of claim 1, wherein the stem and the clamp are constructed as an integrally molded plastic part.

3. The fastener of claim 1, wherein the stem, the spring head and the clamp are constructed as an integrally molded plastic part.

4. The fastener of claim 1, wherein the spring head includes an inner surface and an outer surface such that the biasing member extends from the inner surface.

5. The fastener of claim 4, wherein the spring head includes a radial surface such that an outer edge of the biasing member is at least partially aligned with the radial surface.

6. The fastener of claim 1, wherein, the spring head further includes a second biasing member spiraling around the longitudinal axis of the stem.

7. The fastener of claim 6, wherein the first biasing member and the second biasing member are positioned on opposing sides of the longitudinal axis of the stem.

8. The fastener of claim 7, wherein the spring head includes an inner surface and an outer surface such that the first and second biasing members extend from the inner surface.

9. The fastener of claim 1, wherein the clamp includes a first arm positioned on one side of the longitudinal axis of the stem and a second arm positioned on an opposing side of the longitudinal axis of the stem.

10. The fastener of claim 9, wherein one end on each of the first and second arms is connected to the stem and the other end on each of the first and second arms is connected to a stop.

11. An electronic assembly comprising:

an integrated circuit package;

a heat sink; and a fastener connecting the heat sink to the integrated circuit package to cool the integrated circuit package, the fastener including a stem that extends through the heat sink and the integrated circuit package, the fastener further including a clamp connected to one end of the stem and a spring head connected to an opposing end of the stem, the spring head including a first biasing member spiraling around the longitudinal axis of the stem toward the clamp, the stem, the spring head and the biasing member are constructed as an integrally molded plastic part, the first biasing member compressing the heat sink and the integrated circuit package against the clamp to reduce the thermal impedance between the heat sink and the integrated circuit package.

12. The electronic assembly of claim 11, wherein the integrated circuit package is a chipset mounted to a motherboard.

13. The electronic assembly of claim 11, wherein the spring head further includes a second biasing member spiraling around the longitudinal axis of the stem to compress the heat sink and the integrated circuit package against the clamp.

14. The electronic assembly of claim 13, wherein the first biasing member and the second biasing member are positioned on opposing sides of the longitudinal axis of the stem such that the biasing members generate a compressive force on the heat sink and the integrated circuit package that is substantially parallel to the longitudinal axis of the stem.

15. The electronic assembly of claim 11, further comprising a thermal grease compressed between the integrated circuit package and the heat sink to reduce the thermal impedance between the heat sink and the integrated circuit package.

16. A fastener for an electronic assembly, the fastener comprising:

a stem having a longitudinal axis; and a clamp connected to one end of the stem;

a spring head connected to an opposing end of the stem, the spring head including a first biasing member and a second biasing member that each spiral around the longitudinal axis of the stem toward the clamp, wherein the stem, the spring head, the first and the second biasing member and the clamp are constructed as an integrally molded plastic part, and the spring head includes an inner surface and an outer surface such that the first and second biasing members extend from the inner surface.

17. The fastener of claim 16, wherein the spring head includes a radial surface such that an outer edge on each of the first and second biasing members is at least partially aligned with the radial surface.

18. The fastener of claim 17, wherein the first biasing member and the second biasing member are positioned on opposing sides of the longitudinal axis of the stem.

19. The fastener of claim 16, wherein the clamp includes a first arm positioned on one side of the longitudinal axis of the stem and a second arm positioned on an opposing side of the longitudinal axis of the stem, one end on each of the first and second arms being connected to the stem and the other end on each of the first and second arms being connected to a stop.

* * * * *

UNITED STATES PATENT AND TRADEMARK OFFICE
CERTIFICATE OF CORRECTION

PATENT NO.    : 6,496,372 B1
DATED         : December 17, 2002
INVENTOR(S)   : Davison et al.

It is certified that error appears in the above-identified patent and that said Letters Patent is hereby corrected as shown below:

<u>Column 4,</u>
Line 39, delete "wherein," and insert -- wherein --, therefor.

Signed and Sealed this

Twenty-first Day of June, 2005

JON W. DUDAS
*Director of the United States Patent and Trademark Office*